US008839614B2

United States Patent
An et al.

(10) Patent No.: US 8,839,614 B2
(45) Date of Patent: Sep. 23, 2014

(54) THERMOELECTRIC GENERATOR FOR VEHICLE

(71) Applicant: Hyundai Motor Company, Seoul (KR)

(72) Inventors: Ho-Chan An, Whasung-Si (KR); Jong-Ho Seon, Whasung-Si (KR)

(73) Assignee: Hyundai Motor Company, Seoul (KR)

( * ) Notice: Subject to any disclaimer, the term of this patent is extended or adjusted under 35 U.S.C. 154(b) by 57 days.

(21) Appl. No.: 13/750,658

(22) Filed: Jan. 25, 2013

(65) Prior Publication Data

US 2014/0116035 A1    May 1, 2014

(30) Foreign Application Priority Data

Oct. 25, 2012  (KR) .................. 10-2012-0119122

(51) Int. Cl.
*F01N 3/02* (2006.01)
*H01L 35/32* (2006.01)
*F01N 5/02* (2006.01)

(52) U.S. Cl.
CPC ............ *F01N 5/025* (2013.01); *H01L 35/32* (2013.01)
USPC ............................ 60/320; 60/298; 60/324

(58) Field of Classification Search
CPC .................... F01N 5/025; H01L 35/32
USPC ........... 60/298, 320, 324; 136/205, 210, 212, 136/218
See application file for complete search history.

(56) References Cited

U.S. PATENT DOCUMENTS

| 2005/0172992 | A1* | 8/2005 | Shimoji et al. ........... 136/208 |
| 2005/0172993 | A1* | 8/2005 | Shimoji et al. ........... 136/208 |
| 2006/0179820 | A1* | 8/2006 | Sullivan .................... 60/275 |
| 2010/0180593 | A1* | 7/2010 | Schaller et al. .......... 60/641.2 |
| 2010/0186422 | A1* | 7/2010 | Yang et al. ................. 62/3.3 |
| 2011/0311421 | A1* | 12/2011 | Backhaus-Ricoult et al. ................ 423/213.2 |
| 2012/0060484 | A1 | 3/2012 | Eder et al. |

FOREIGN PATENT DOCUMENTS

JP    2004-350479 A    12/2004
JP    2011-155790 A    8/2011

* cited by examiner

*Primary Examiner* — Thomas Denion
*Assistant Examiner* — Jason Shanske
(74) *Attorney, Agent, or Firm* — Morgan, Lewis & Bockius LLP

(57) ABSTRACT

A thermoelectric generator for a vehicle is mounted at an exhaust pipe and produces electricity using a temperature difference between the exhaust gas and coolant. The generator includes: a housing; thermoelectric modules mounted at an outer circumferential surface of the housing; a plurality of coolant tubes mounted so as to closely attach the thermoelectric module to the housing; first coolant containers mounted at both ends of the coolant tubes, respectively; and second coolant containers mounted at both ends of the coolant tubes, respectively. The coolant tubes are assembled to the first and second coolant containers as a modularized type, and thus assemblability may be improved and partial replacement of components in case of breakdown may be easily performed. In the coolant tube of the present invention, heat exchange is concentratedly performed at a portion in contact with the thermoelectric module, and thus generation efficiency may be more improved.

6 Claims, 4 Drawing Sheets

THERMOELECTRIC GENERATOR FOR VEHICLE

CROSS-REFERENCE TO RELATED APPLICATIONS

The present application claims priority of Korean Patent Application Number 10-2012-0119122 filed Oct. 25, 2012, the entire contents of which application is incorporated herein for all purposes by this reference.

BACKGROUND OF INVENTION

1. Field of Invention

The present invention relates to a thermoelectric generator for a vehicle, and more particularly, to a thermoelectric generator for a vehicle, which improves electric power generation efficiency by maximizing a temperature difference between both sides of a thermoelectric module and has a configuration that makes assembly and replacement of components easier.

2. Description of Related Art

Thermoelectric generation is a technology that generates electricity using an electric potential difference between a heating element and a cooling element, and has an advantage of being capable of producing electric energy directly from a heat source without mechanical operations.

The thermoelectric generation method has already been used for a long time in fields other than automobiles, such as power supply facilities for remote areas, planet probes (Voyager II) or the like, and recently is considered to be applied to a waste heat utilization system for a waste incinerator, geothermal power generation, ocean temperature difference power generation or the like.

Meanwhile, when considering the flow of energy in automobiles, chemical energy of gasoline is converted to mechanical energy by combustion in an engine, but the thermal efficiency is just 30%, and the remaining energy is dissipated as thermal energy, vibration energy, sound energy or the like.

Therefore, recycling of the dissipated energy is required for improving fuel economy. Further, because the heat energy dissipated from heat source having a higher temperature is more useful among the dissipated energy, a method of using exhaust heat of the engine, which is in the range of a high temperature of hundreds degrees, as a high temperature heat source is being developed.

Meanwhile, because efficiency of an alternator, which is used for supplying electricity to vehicles, is just 33%, and shaft power needs to be increased as power consumption in a vehicle increases, there is a problem in that a loss of the shaft power is increased, and high fuel consumption and emission of pollutants are increased.

Here, the amount of energy consumed for driving the alternator changes in accordance with driving states of vehicles and power consumption state, but the energy is also consumed during general driving at daytime when power consumption is low.

Therefore, an additional electric power generation such as thermoelectric generation shares the function of the alternator, and thus the fuel economy may be expected to be improved.

The thermoelectric generation applied to vehicles has been open to public as a technology that produces electricity using exhaust heat of exhaust gas and coolant. More particularly, a thermoelectric module including p-type and n-type conductors or semiconductors and mounted at an exhaust pipe is configured to have one side that is in contact with the exhaust gas and the other side that is in contact with the coolant.

Here, a temperature difference between a heat source (the exhaust gas) and a cooling source (the coolant), which is transferred to the thermoelectric module, needs to increase in order to increase electric power generation efficiency of the thermoelectric module.

The information disclosed in this Background section is only for enhancement of understanding of the general background of the invention and should not be taken as an acknowledgement or any form of suggestion that this information forms the prior art already known to a person skilled in the art.

SUMMARY OF INVENTION

Various aspects of the present invention provide for a thermoelectric generator for a vehicle, having advantages of improving electric power generation efficiency by maximizing a temperature difference between a heat source and a cooling source, facilitating assembly, and simplifying replacement of components in case of breakdown.

Various aspects of the present invention provide for a thermoelectric generator for a vehicle, which is mounted at an exhaust pipe through which exhaust gas flows and produces electricity using a temperature difference between the exhaust gas and coolant, the thermoelectric generator including: a housing formed in a pipe shape so that the exhaust gas flows in from a front side and a discharged to a rear side, the housing in which the exhaust pipe is penetratively mounted; thermoelectric modules which are mounted at an outer circumferential surface of the housing so as to form a plurality of columns along a longitudinal direction of the housing and produce electricity according to the temperature difference; a plurality of coolant tubes through which the coolant flows, the plurality of coolant tubes mounted so as to closely attach the thermoelectric module to the housing and attached for each of the columns of the thermoelectric module; first coolant containers mounted at both ends of the coolant tubes, respectively, so that the coolant tubes positioned at one side in a longitudinal direction of the housing are opened, the first coolant containers in which the coolant flows in and out; and second coolant containers mounted at both ends of the coolant tubes, respectively, so that the coolant tubes positioned at the other side in the longitudinal direction of the housing are opened, the second coolant containers in which the coolant flows in and out.

The exhaust pipe may be mounted so that the exhaust gas flows in between the housing and the exhaust pipe, the exhaust pipe may be divided into a first exhaust pipe positioned at a relatively front side in a longitudinal direction and a second exhaust pipe positioned at a relatively rear side, a valve plate may be mounted at the rear end of the first exhaust pipe and connected to a spring so as to block a rear end of the first exhaust pipe according to pressure of the exhaust gas, and a punched hole, which the exhaust gas bypasses when the rear end of the first exhaust pipe is blocked, may be formed at an outer circumferential surface of the first exhaust pipe.

A thermal conductive member may be built in between the exhaust pipe and the housing, and the thermal conductive member may be formed in a porous mesh structure which allows the exhaust gas to pass therethrough and absorbs heat.

Connecting members having elasticity may be mounted at both ends of the coolant tube, and the coolant tube may be connected to the first coolant container and the second coolant container by the connecting members.

The thermoelectric generator for a vehicle may further include a clamp wound along a circumference of the housing so that the coolant tubes are closely attached to the thermoelectric modules.

The coolant tube may be made of a metallic material such as steel or aluminum.

In the present invention, the coolant tubes are assembled to the first coolant containers and the second coolant containers as a modularized type, and thus assemblability may be improved and partial replacement of components in case of breakdown may be easily performed.

In the coolant tube of the present invention, heat exchange is not performed over the whole region of the coolant tube, but is concentratedly performed only at a portion in contact with the thermoelectric module, and thus generation efficiency may be more improved.

In the present invention, electric power generation is performed when the exhaust gas flows in an appropriate amount, and the exhaust gas is rapidly discharged when the exhaust gas flows in a large amount (to such an extent that elastic force of a spring is overcome), and thus decrease of output power of an engine and overheating of the thermoelectric module may be prevented.

The coolant tubes are connected to the first coolant containers or the second coolant containers by connecting members or rubbers having elasticity, and thus assembly tolerance and a gap between the components may be absorbed.

The methods and apparatuses of the present invention have other features and advantages which will be apparent from or are set forth in more detail in the accompanying drawings, which are incorporated herein, and the following Detailed Description, which together serve to explain certain principles of the present invention.

DETAILED DESCRIPTION

Reference will now be made in detail to various embodiments of the present invention(s), examples of which are illustrated in the accompanying drawings and described below. While the invention(s) will be described in conjunction with exemplary embodiments, it will be understood that present description is not intended to limit the invention(s) to those exemplary embodiments. On the contrary, the invention(s) is/are intended to cover not only the exemplary embodiments, but also various alternatives, modifications, equivalents and other embodiments, which may be included within the spirit and scope of the invention as defined by the appended claims.

Hereinafter, a thermoelectric generator for a vehicle according to various embodiments of the present invention will be described in more detail with reference to accompanying drawings.

Figure 1:
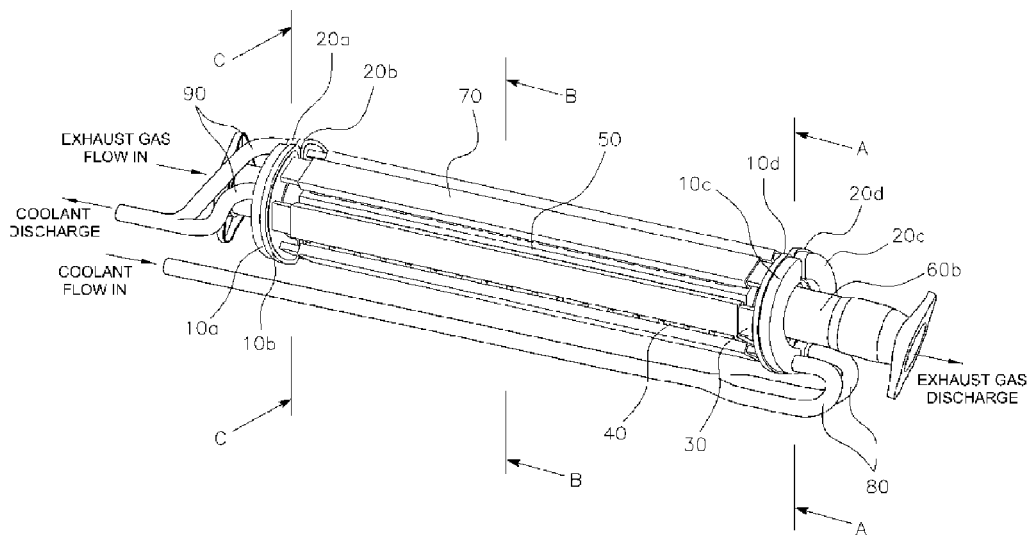
FIG. 1 is a perspective view of an exemplary thermoelectric generator for a vehicle according to the present invention.
Figure 2A:
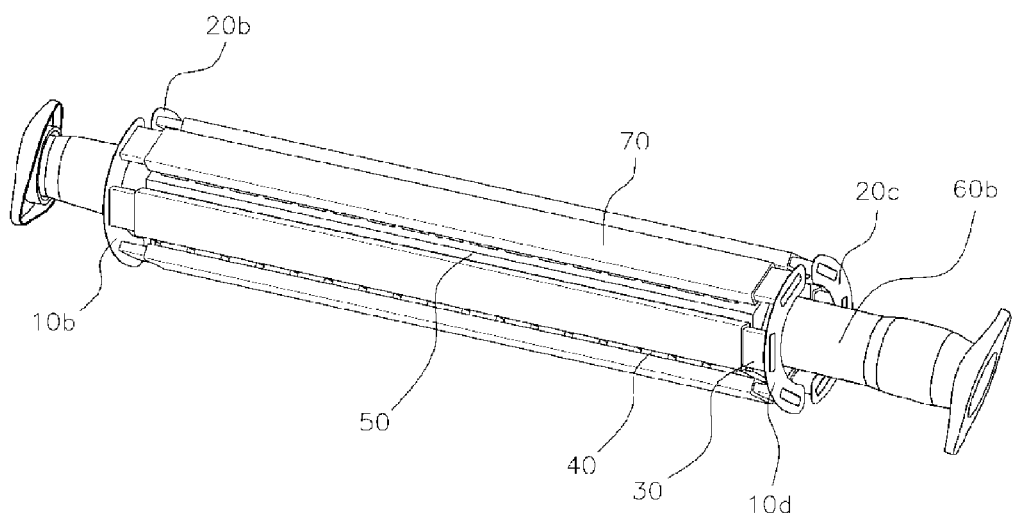
FIG. 2A is a perspective view illustrating a shape in which cover portions of first coolant containers and second coolant containers are removed from FIG. 1.
Figure 2B:
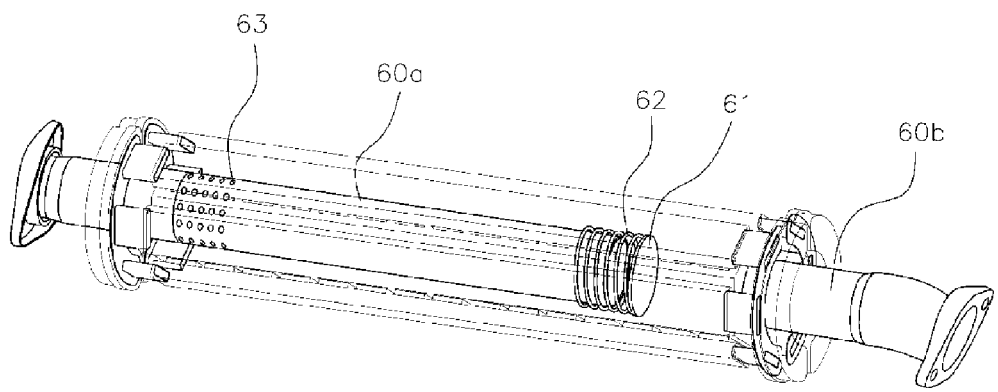
FIG. 2B is a perspective view illustrating an exhaust pipe mounted inside a housing illustrated in FIG. 1.

Referring to FIGS. 1, 2A and 2B, a housing 50 of the present invention has a pipe shape, and an exhaust pipe 60 (60a and 60b) is penetratively mounted in the housing 50. The exhaust pipe 60 is configured such that a front side (a left side of drawings) thereof is connected to an engine and exhaust gas is discharged to a rear side (a right side of drawings) thereof. The exhaust pipe 60 is configured to be divided into a first exhaust pipe 60a positioned at the relatively front side in a longitudinal direction and a second exhaust pipe 60b positioned at the relatively rear side, so that the exhaust gas flows in or flows out of the inside of the housing 50, that is, the exhaust gas flows in between the housing 50 and the exhaust pipe 60.

In addition, a valve plate 61 is mounted at a rear end of the first exhaust pipe 60a and connected to a spring 62 so as to block the rear end of the first exhaust pipe 60a according to pressure of the exhaust gas, and a punched hole 63, which the exhaust gas bypasses when the rear end of the first exhaust pipe 60a is blocked, is formed at an outer circumferential surface of the first exhaust pipe 60a.

Meanwhile, a plurality of thermoelectric modules 40, which produces electricity according to a temperature difference between one side and the other side thereof, is attached to an outer circumferential surface of the housing 50. The thermoelectric modules 40 have a plate shape in which two flat surfaces are formed and are mounted so as to form a plurality of columns along a longitudinal direction of the housing 50. The columns formed by the plurality of thermoelectric modules 40 are disposed side by side along a circumference of the housing 50.

One of the flat surfaces of the thermoelectric module 40 is attached to the outer circumferential surface of the housing 50, and the other surface is closely attached to be pressed by a coolant tube 70. A coolant flows inside the coolant tube 70 in a longitudinal direction of the coolant tube 70. A plurality of coolant tubes 70 is configured to be closely attached for each of the columns of the thermoelectric modules 40.

In the present invention, first coolant containers 10 (10a, 10b, 10c and 10d) and second coolant containers 20 (20a, 20b, 20c and 20d) are provided to fix the coolant tubes 70 to the housing 50. The first coolant containers 10 and the second coolant containers 20 have parentheses shapes facing each other, namely, "("and")" shapes, respectively, so that the first coolant container 10 and the second coolant container 20 allow the exhaust pipe 60 to pass therethrough and may be mounted at a front side and a rear side of the housing 50.

The first coolant containers 10 and the second coolant containers 20 include cover portions 10b, 10d, 20b and 20d to which a connecting member 30 is fitted, and bulk portions 10a, 10c, 20a and 20c which are coupled to the cover portions so as to provide spaces in which the coolant may flow.

As illustrated, the first coolant containers 10 are positioned at one side in the longitudinal direction (a lengthwise direction) of the housing 50, and the second coolant containers 20 are positioned at the other side in the longitudinal direction of the housing 50 so as to face the first coolant containers 10. The first coolant containers 10 and the second coolant containers 20 are connected to a coolant inlet pipe 80 and a coolant discharge pipe 90, respectively, so that the coolant flows in and out of both ends of the coolant tubes 70.

Figure 3:
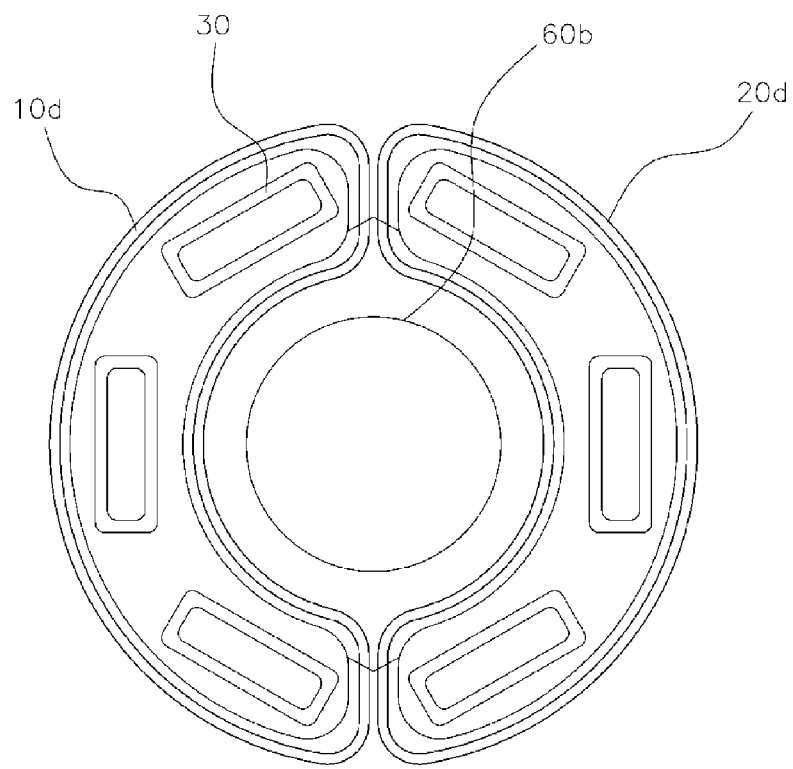
FIG. 3 is a cross-sectional view taken along line A-A of FIG. 1.
Figure 5:
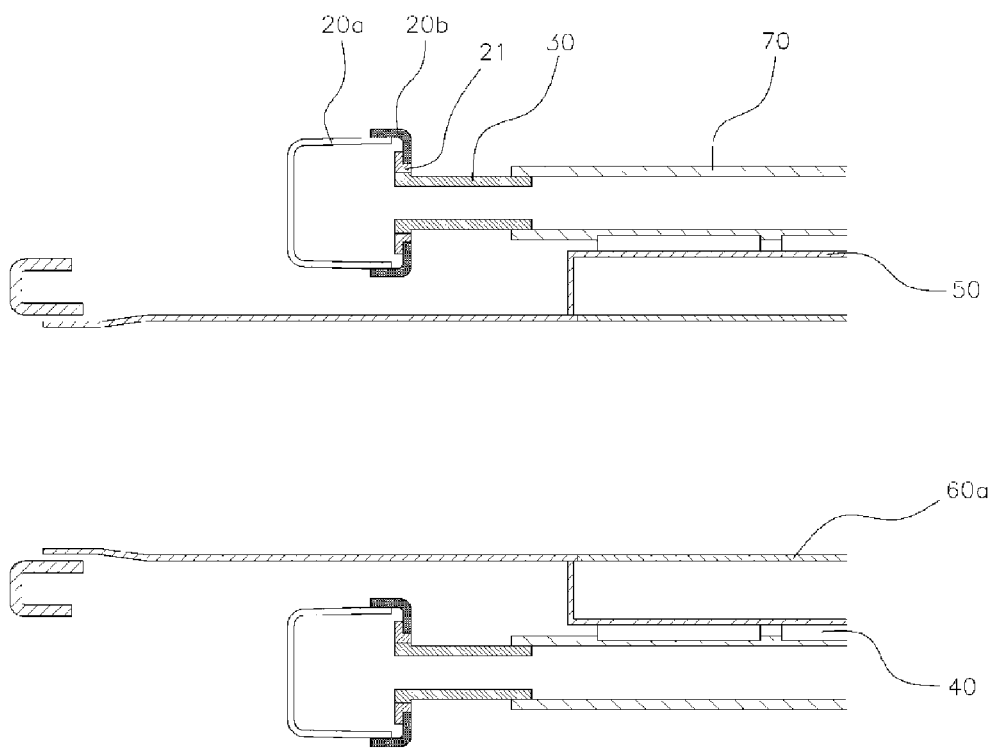
FIG. 5 is a cross-sectional view taken along line C-C of FIG. 1.

Meanwhile, as illustrated in FIGS. 3 and 5, the connecting members 30 are mounted at both ends of the coolant tubes 70, and the coolant tubes 70 are connected to the first coolant containers 10 or the second coolant containers 20 by the connecting members 30.

The connecting members 30 may be made of synthetic rubber or synthetic resin having predetermined elasticity so as to absorb assembly tolerance, or integrally formed with the coolant tubes 70. In addition, in a case in which the connecting members 30 are integrally formed with the coolant tubes 70, rubbers 21 having elasticity may be interposed between the cover portions 10b, 10d, 20b and 20d and the connecting members 30 so as to absorb assembly tolerance as described above.

Figure 4:
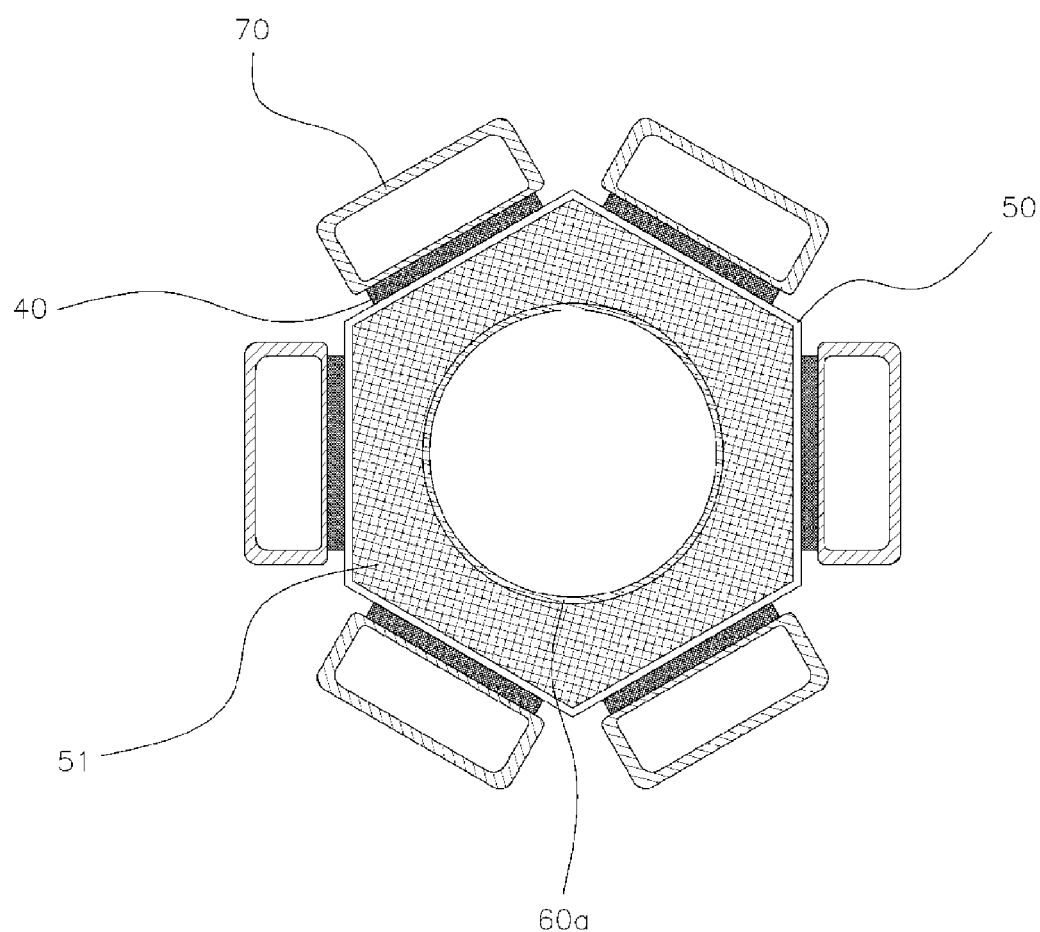
FIG. 4 is a cross-sectional view taken along line B-B of FIG. 1.

In the present invention, a thermal conductive member 51 is built in between the exhaust pipe 60 and the housing 50, as illustrated in FIG. 4, so as to maximize contact areas with the exhaust gas when the exhaust gas flows. The thermal conductive member 51 has a porous structure so as to allow the exhaust gas to pass therethrough and absorb heat. For example, the thermal conductive member 51 may be formed by processing a metallic material having high thermal conductivity to be formed in a mesh shape and forming the metallic material so as to be insertable in the housing, and thereby being inserted in the housing 50.

While the coolant tubes 70 are fixed to both ends of the housing 50 by the first coolant container 10 and the second coolant container 20, at least one clamp (not illustrated) may be additionally provided to prevent the coolant tube 70 and the thermoelectric module 40 from being moved away from each other, or to prevent an adhesive force from decreasing, near a middle position (a center position of the housing 50). Namely, the clamp is configured to be wound (along the circumference of the housing 50 at an outer side of the coolant tube 70) so that the coolant tubes 70 are closely attached to the thermoelectric modules 40.

Meanwhile, the coolant tube 70 according to the present invention may be made of a metallic material, but may be made of synthetic resin having relatively low thermal conductivity in order to prevent heat from being conducted to an unnecessary portion (a portion not in contact with the thermoelectric module 40).

The thermoelectric generator for a vehicle of the present invention, which generates electricity using a temperature difference between waste heat of the exhaust gas and the coolant, has the bypass structure, so that the exhaust gas is rapidly exhausted to prevent overheating of the thermoelectric module 40 and decrease of output power of the engine when the exhaust gas is exhausted in a large amount, and electric power generation is performed only when the exhaust gas is exhausted in an appropriate amount.

In the present invention, the coolant tubes 70 are connected to be separated in a state in which the first coolant containers 10 and the second coolant containers 20 are separated, and thus assembly and replacement of components may be easy. Further, (as illustrated in FIG. 1,) an inflow of the coolant is performed at a lower side of the first coolant containers 10 and the second coolant containers 20, and an outflow of the coolant is performed at an upper side of the first coolant containers 10 and the second coolant containers 20, and thus circulation of the coolant may be more efficiently performed.

For convenience in explanation and accurate definition in the appended claims, the terms upper or lower, front or rear, and etc. are used to describe features of the exemplary embodiments with reference to the positions of such features as displayed in the figures.

The foregoing descriptions of specific exemplary embodiments of the present invention have been presented for purposes of illustration and description. They are not intended to be exhaustive or to limit the invention to the precise forms disclosed, and obviously many modifications and variations are possible in light of the above teachings. The exemplary embodiments were chosen and described in order to explain certain principles of the invention and their practical application, to thereby enable others skilled in the art to make and utilize various exemplary embodiments of the present invention, as well as various alternatives and modifications thereof. It is intended that the scope of the invention be defined by the Claims appended hereto and their equivalents.

What is claimed is:

1. A thermoelectric generator for a vehicle mounted at an exhaust pipe through which exhaust gas flows and produces electricity using a temperature difference between the exhaust gas and coolant, the thermoelectric generator comprising:
    a cylindrical housing through which the exhaust pipe is penetratively mounted; thermoelectric modules mounted at an outer circumferential surface of the housing so as to form a plurality of columns along a longitudinal direction of the housing, which thermoelectric modules produce electricity according to the temperature difference;
    a plurality of coolant tubes through which the coolant flows, the plurality of coolant tubes mounted so as to closely attach the thermoelectric modules to the housing and closely attached for each of the columns of the thermoelectric modules;
    first coolant containers mounted at opposing ends of the coolant tubes, respectively, so that the coolant tubes positioned at one side in a longitudinal direction of the housing are opened, the first coolant containers in which the coolant flows in and out; and
    second coolant containers mounted at opposing ends of the coolant tubes, respectively, so that the coolant tubes positioned at the other side in the longitudinal direction of the housing are opened, the second coolant containers in which the coolant flows in and out.

2. The thermoelectric generator of claim 1, wherein:
    the exhaust pipe is mounted so that the exhaust gas flows in between the housing and the exhaust pipe,
    the exhaust pipe is divided into a first exhaust pipe positioned at a forward side in a longitudinal direction and a second exhaust pipe positioned at a rear side,
    a valve plate is mounted at the rear end of the first exhaust pipe and connected to a spring to block a rear end of the first exhaust pipe according to pressure of the exhaust gas, and
    a punched hole, which the exhaust gas bypasses when the rear end of the first exhaust pipe is blocked, is formed at an outer circumferential surface of the first exhaust pipe.

3. The thermoelectric generator of claim 2, wherein a thermal conductive member is disposed between the exhaust pipe and the housing, and the thermal conductive member is formed in a porous structure which allows the exhaust gas to pass therethrough and absorbs heat.

4. The thermoelectric generator of claim 1, wherein connecting members are mounted at opposing ends of the coolant tubes, and the coolant tubes are connected to the first coolant containers and the second coolant containers by the connecting members.

5. The thermoelectric generator of claim 1, further comprising:
    a clamp wound along a circumference of the housing so that the coolant tubes are closely attached to the thermoelectric modules.

6. The thermoelectric generator of claim 1, wherein the coolant tubes are made of a metallic material.

* * * * *